(12) United States Patent
Yazawa et al.

(10) Patent No.: US 9,705,449 B2
(45) Date of Patent: Jul. 11, 2017

(54) EFFECTIVE AND SCALABLE SOLAR ENERGY COLLECTION AND STORAGE

(71) Applicant: THE REGENTS OF THE UNIVERSITY OF CALIFORNIA, Oakland, CA (US)

(72) Inventors: Kazuaki Yazawa, Santa Cruz, CA (US); Zhixi Bian, Watsonville, CA (US); Ali Shakouri, Santa Cruz, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 353 days.

(21) Appl. No.: 14/345,933

(22) PCT Filed: Sep. 28, 2012

(86) PCT No.: PCT/US2012/058125
§ 371 (c)(1),
(2) Date: Mar. 19, 2014

(87) PCT Pub. No.: WO2013/049724
PCT Pub. Date: Apr. 4, 2013

(65) Prior Publication Data
US 2014/0224295 A1 Aug. 14, 2014

Related U.S. Application Data

(60) Provisional application No. 61/540,289, filed on Sep. 28, 2011.

(51) Int. Cl.
*H01L 31/052* (2014.01)
*H02S 40/42* (2014.01)
(Continued)

(52) U.S. Cl.
CPC .............. *H02S 40/425* (2014.12); *F01K 3/00* (2013.01); *F24J 2/0477* (2013.01); *F24J 2/30* (2013.01);
(Continued)

(58) Field of Classification Search
CPC ........ F24J 2/345; F24J 2/14; F24J 2/10; F24J 2/085; F24J 2/12; F24J 2/38; F24J 2/1047;
(Continued)

(56) References Cited

U.S. PATENT DOCUMENTS 3,894,605 A * 7/1975 Salvadorini ........... B60L 11/123
180/65.245
4,002,031 A * 1/1977 Bell ....................... F03G 6/001
126/698
(Continued)

FOREIGN PATENT DOCUMENTS

CN WO 2011091620 A1 * 8/2011 ............. H01L 35/30
RU 1815527 A1 5/1993
(Continued)

OTHER PUBLICATIONS

International Search Report mailed Jan. 24, 2013, for PCT Application No. PCT/US2012/058125, filed Sep. 28, 2012, two pages.

*Primary Examiner* — Eric R Smith
(74) *Attorney, Agent, or Firm* — Morrison & Foerster LLP

(57) ABSTRACT

Solar energy collection and storage systems and processes of using such systems. Non-direct solar energy collection and storage systems can generate electricity from solar radiation using a solar thermoelectric generator and at the same time capture solar thermal energy in a working fluid. The working fluid can then transfer the heat to a thermal storage medium where the heat can be retrieved on demand to generate
(Continued)

electricity and heat a fluid. Direct solar energy collection and storage systems can store solar thermal energy in a thermal storage medium directly from solar radiation and the heat from the thermal storage medium can be used on demand to generate electricity and heat a fluid.

13 Claims, 4 Drawing Sheets

(51) Int. Cl.
    *F24J 2/04*    (2006.01)
    *F24J 2/30*    (2006.01)
    *F24J 2/34*    (2006.01)
    *F24J 2/42*    (2006.01)
    *F01K 3/00*    (2006.01)
    *F28D 20/02*   (2006.01)
    *F24D 19/10*   (2006.01)
    *F28D 20/00*   (2006.01)
    *H02S 40/44*   (2014.01)

(52) U.S. Cl.
    CPC . *F24J 2/34* (2013.01); *F24J 2/42* (2013.01); *F28D 20/0034* (2013.01); *F28D 20/02* (2013.01); *H01L 31/052* (2013.01); *H02S 40/44* (2014.12); *F24D 19/1042* (2013.01); *Y02E 10/40* (2013.01); *Y02E 10/60* (2013.01); *Y02E 60/142* (2013.01); *Y02E 60/145* (2013.01); *Y02E 70/30* (2013.01)

(58) Field of Classification Search
    CPC .......... F24J 2/16; F24J 2/32; F24J 2/44; F24J 2/4625; F24J 2/5403; F24J 2/541; F24J 2/5413; F24J 2002/1023; F24J 2/4621; H01L 31/052; H01L 31/0522; H01L 31/0521; H01L 31/058; H01L 31/0525; H01L 31/0422; H01L 31/035281; H01L 31/02327; H01L 35/30; H01L 23/473; H01L 23/648; H01L 31/024; H01L 31/0406; Y02E 10/52; Y02E 10/60; Y02E 10/44; F24D 19/1042; F24D 17/0078; F28D 15/0233; F28F 3/12; F28F 1/34; H02S 40/40; H02S 40/42; H02S 40/425
    USPC .................................................. 136/243–265
    See application file for complete search history.

(56) References Cited

U.S. PATENT DOCUMENTS

| | | | | |
|---|---|---|---|---|
| 4,771,764 | A | * | 9/1988 | Cluff ........................ F24J 2/08 126/577 |
| 6,080,927 | A | * | 6/2000 | Johnson ..................... F24J 2/07 126/562 |
| 2009/0211249 | A1 | * | 8/2009 | Wohrer ..................... F01K 3/00 60/641.8 |
| 2010/0319684 | A1 | * | 12/2010 | Almogy ................. F24D 11/003 126/714 |
| 2012/0132257 | A1 | | 5/2012 | Combelic |
| 2012/0227779 | A1 | * | 9/2012 | Miao ...................... H01L 35/30 136/206 |

FOREIGN PATENT DOCUMENTS

| | | |
|---|---|---|
| RU | 2225966 C1 | 3/2004 |
| WO | WO-2013/049724 A1 | 4/2013 |

* cited by examiner

TOP VIEW ial Application No.
EFFECTIVE AND SCALABLE SOLAR ENERGY COLLECTION AND STORAGE

CROSS REFERENCE TO RELATED APPLICATIONS

This application is a U.S. National Phase application under 35 U.S.C. §371 of International Application No. PCT/US2012/058125, filed Sep. 28, 2012, which claims the benefit of U.S. Provisional Application No. 61/540,289, filed Sep. 28, 2011, the contents of which are hereby incorporated herein by reference in their entireties.

FIELD OF THE DISCLOSURE

The application relates to an effective and scalable solar energy collection and storage system. In particular, the present disclosure provides a solar energy collection and storage system that converts solar energy into electricity and stores the unused energy in thermal form. Heat from the thermal storage medium enables thermoelectric generation of electricity and hot water on demand. This can reduce the problem with intermittency of solar radiation and allow generation of electricity and heat on demand.

BACKGROUND

As the world strives to meet the demand for electricity, sustainable energy technologies are attracting significant attention. The world has set its sights on renewable energy sources as a way to meet this demand and, at the same time, lower the world's dependence on fossil fuels and decrease carbon dioxide emissions. Currently, however, renewable energy sources such as solar energy, wind power, hydropower, biofuel, biomass, and geothermal energy only supply a small amount of the electricity consumed worldwide. Little electricity is currently produced from renewable energy sources because of the relatively high cost associated with the materials and the technology used to generate electricity from these renewable energy sources. This is especially true for solar electricity generation.

The two most common forms of solar electricity generation are solar thermal generation and solar photovoltaic generation. Solar thermal generation converts solar energy into heat and then uses the heat to generate electricity. A typical solar thermal generation process consists of storing the heat from solar energy in a fluid and then using the heated fluid in mechanical engines such as Stirling engines or Rankine engines to generate electricity. Solar photovoltaic generation converts solar energy directly into electricity. While the cost [$/W] of the solar thermal electricity generation is lower than the cost of solar photovoltaic electricity generation, solar thermal electricity generation is mostly effective for large size systems and is not readily scalable for distributed power generation in residential homes or office buildings. On the other hand, solar photovoltaic generation is scalable and is widely used in residential locations; however, photovoltaic cells are expensive and the solar energy that is not used by the photovoltaic cell is wasted in the form of heat.

An alternative to solar thermal electricity generation and solar photovoltaic electricity generation is the direct conversion of solar energy into electricity by a solar thermoelectric system. Thermoelectric generators convert thermal energy directly into electricity, relying on the Seebeck effect in solid materials. The Seebeck effect is a process whereby a temperature difference across a material generates electricity. In a solar thermoelectric generator, solar radiation is absorbed and the heat generated from the solar radiation is transferred to the hot side of the thermoelectric device, thereby creating a temperature difference across the thermoelectric device which produces electricity via the Seebeck effect. Also, solar thermoelectric generators are scalable and relatively cost effective for residential applications.

Regardless of what solar electricity generation system is used, the main problem associated with solar energy is that it is an inherently intermittent energy source. Solar radiation output varies throughout the day and is often affected by cloud cover. Thus, an important aspect of solar electricity generation is being able to store solar energy and being able to use the solar energy to generate electricity to meet the demand when the solar radiation output is low. Another problem with solar electricity generation is that the conversion efficiency between solar energy to electricity is low and a substantial amount of solar energy is wasted in the form of heat. To counteract this, the wasted heat from the solar electricity generation could be recovered and used for a solar fluid heating system or for another thermoelectric generation system and therefore increase energy conversion efficiency.

BRIEF SUMMARY

A solar energy collection and storage process can include configuring a solar radiation concentrator, concentrating solar radiation on a first side of a first energy converter, and generating electricity via the first energy converter. The solar concentrator could be on a sun ray tracking system to maximize the output power. The process can further include heating a first fluid by pumping the first fluid through a first heat exchanger that is attached to a second side of the first energy converter, heating a thermal storage medium with the heated first fluid, and heating a second fluid by pumping the second fluid through the thermal storage medium. The second fluid can be moved through a second heat exchanger that is attached to a first side of a second energy converter and electricity can be generated via the second energy converter. A third fluid can be heated by pumping the third fluid through a third heat exchanger that is attached to a second side of the second energy converter and the heated third fluid can be stored in a fluid storage vessel.

A system for carrying out the process can include a first energy converter with a first side and a second side, a solar radiation concentrator so as to concentrate solar radiation on the first side of the first energy converter, and a first heat exchanger attached to the second side of the first energy converter. This system can further include a sun-ray tracker configured to move the solar radiation concentrator. This system can further include a first pump configured to move a first fluid through the first heat exchanger and then through a thermal storage medium, a second energy converter with a first side and a second side, and a second heat exchanger attached to the first side of the second energy converter. A second pump can be configured to move a second fluid through the thermal storage medium and then through the second heat exchanger, wherein the thermal storage medium is configured to allow the first fluid to move through the thermal storage medium without coming into contact with the second fluid. This system can further include a third heat exchanger attached to the second side of the second energy converter and a third pump configured to move a third fluid through the third heat exchanger and then into a fluid storage vessel.

A second solar energy collection and storage process can include configuring a sun-ray tracking system to move a solar radiation concentrator and concentrating solar radiation on a light pipe, light tube, prism, sun scope, or sun pipe, which guides and changes direction of the concentrated solar light. The light pipe can be configured to introduce the solar radiation into a thermal storage medium that is attached to a first side of an energy converter. The thermal storage medium can be heated with solar radiation and electricity can be generated via the energy converter. A fluid can be heated by pumping the fluid through a heat exchanger that is attached to a second side of the energy converter and the heated fluid can be stored in a fluid storage vessel.

A system for carrying out the second process can include an energy converter with a first side and a second side and a sun-ray tracker configured to move a solar radiation concentrator so as to concentrate solar radiation on a light tube, wherein the light tube is configured to direct solar radiation into a thermal storage medium attached to the first side of the energy converter. This second system can further include a heat exchanger attached to the second side of the energy converter and a pump configured to move a fluid through the heat exchanger and then into a fluid storage vessel.

BRIEF DESCRIPTION OF THE DRAWINGS

The various embodiments will become more fully understood from the detailed description and the accompanying figures, wherein.

DETAILED DESCRIPTION

Figure 1:
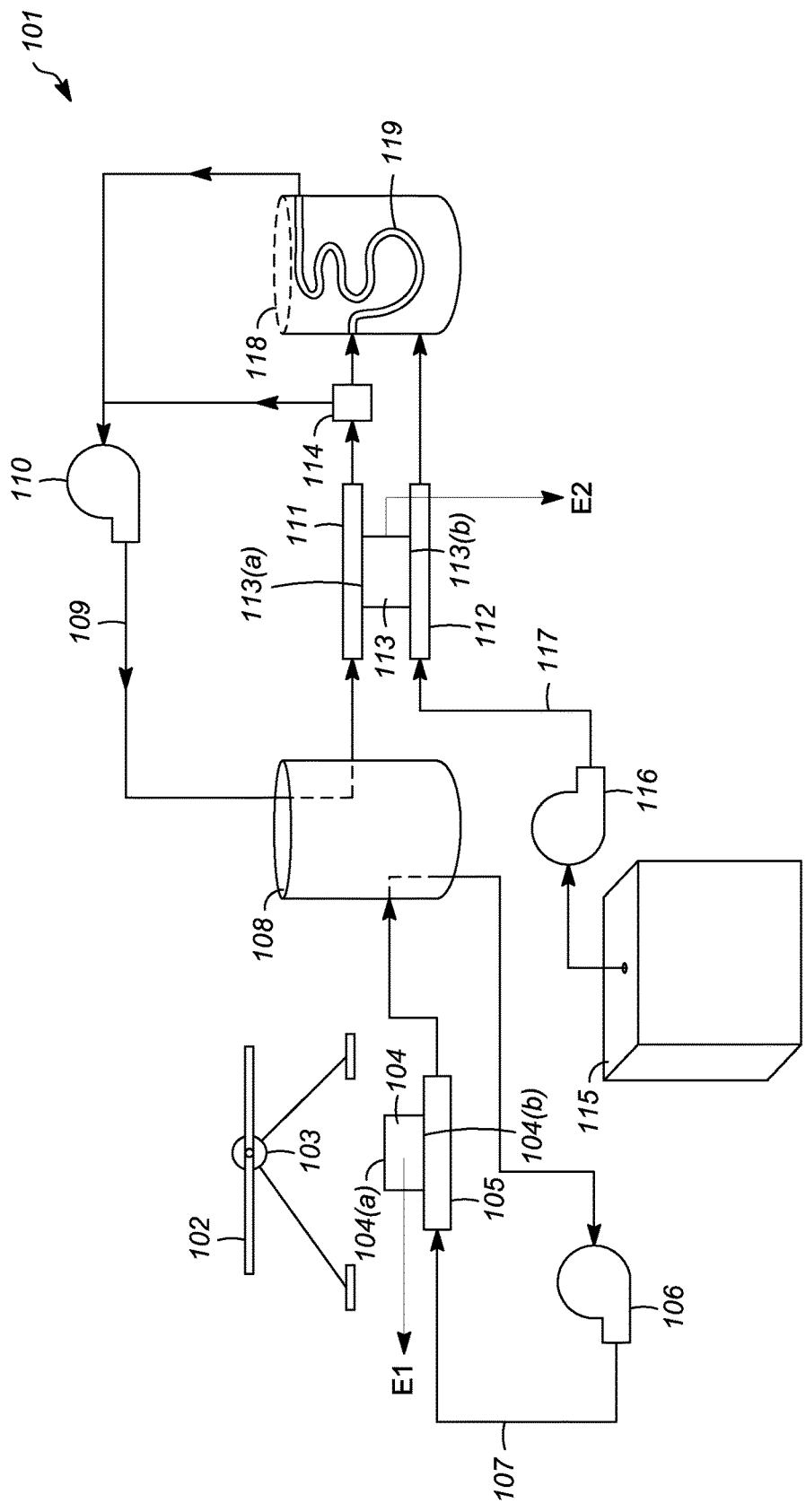
FIG. 1 depicts a solar energy collection and storage system containing two separate fluid closed loops.

The solar energy collection and storage system 101 depicted in FIG. 1 can generate electricity $E_1$ directly from solar radiation using a solar thermoelectric generator 104 and at the same time capture solar thermal energy in a working fluid 107. The working fluid 107 can then transfer the heat to a thermal storage medium 108 where the heat can be retrieved on demand to generate electricity $E_2$ and heat a liquid, such as water.

The solar energy collection and storage system 101 can include a solar radiation concentrator 102. The solar radiation concentrator 102 can be a parabolic reflector, a Fresnel lens, a liquid solar lens, or any other device that gathers solar radiation and concentrates it. A sun-ray tracker 103 can be included to move the solar radiation concentrator 102 so as to align it with a solar radiation source, normally the sun, in order to maximize the amount of solar radiation that comes in contact with the solar radiation concentrator 102. Generally, a sun-ray tracking device adjusts the solar concentrator so as to keep it perpendicular to solar radiation. There are various sun-ray tracking devices that can be used as sun-ray tracker 103. Most sun-ray tracking devices can include a moving mechanism that attaches to the concentrator with a solar radiation sensing unit and a controller.

Together the solar radiation concentrator 102 and the sun-ray tracker 103 can direct the solar radiation that is to be absorbed by the hot side 104(a) of the solar thermoelectric generator 104. The solar thermoelectric generator 104 can also be a photovoltaic electrical generator. The photovoltaic electrical generator should be designed to operate at high temperatures (e.g., >100° C.). Furthermore, multiple thermoelectric generators can be used in series, especially for large scale solar energy production.

The rate at which solar radiation is absorbed on the hot side 104(a) of the solar thermoelectric generator 104 can be called the solar radiation heat flux and can be measured in Watt/m$^2$. The solar radiation concentrator 102, sun-ray tracker 103, and the solar thermoelectric generator 104 can be positioned so that the solar radiation heat flux is maximized on the hot side 104(a) of the solar thermoelectric generator 104. For example, higher heat flux, in the range of $10^5$ to $10^6$ Watt/m$^2$, which is 100 to 1000 times higher than the heat flux of natural solar radiation to the ground of the Earth, can yield high energy gain. On the other hand, if the solar radiation is not accurately directed on the hot side 104(a) of the solar thermoelectric generator 104, the system can experience a loss of solar energy. In some cases the system can be designed without a solar tracker. Typically lower concentrator values should be used and the system is optimized for solar energy production during shorter periods each day. The advantage is less cost and no external moving parts.

In addition, the positioning of the solar radiation concentrator 102, sun-ray tracker 103, and the solar thermoelectric generator 104 can minimize the total material cost of the system. A properly designed system can minimize the size of the devices needed to collect solar energy and therefore decrease the material cost. For example, if the solar radiation concentrator 102 did not sufficiently concentrate solar radiation on the hot side 104(a) of the solar thermoelectric generator 104, a larger and more expensive solar thermoelectric generator 104 would be needed to absorb the same amount of solar radiation since a hot side 104(a) with a larger surface area would be needed to absorb the solar radiation that was not sufficiently concentrated and directed toward the desired location.

The solar radiation directed onto the hot side 104(a) can increase the temperature of the hot side 104(a) of the solar thermoelectric generator 104 and can create a temperature difference between the hot side 104(a) and the cold side 104(b) of the solar thermoelectric generator 104. A temperature difference across a thermoelectric generator produces electricity. The greater the temperature difference, the higher the electricity production. The electricity production is known to be close to the square of the temperature difference when the system is designed for maximum power operation. Thus, electricity $E_1$ can be generated from the temperature difference across the solar thermoelectric generator 104.

As the hot side 104(a) continues to absorb the solar radiation, waste heat resulting from electricity generation from the hot side 104(a) transfers to the cold side 104(b) via heat conduction through the thermoelectric materials. Heat conduction is the transfer of heat from hot to cold within a solid or between solid objects. To maintain a large temperature difference, the conducted heat should be removed effectively. A heat exchanger 105 can be attached to the cold side 104(b) to remove heat from the cold side 104(b). By removing the heat from the cold side 104(b), a physically tolerable high temperature can be maintained at the hot side of thermoelectric generator 104.

A working fluid 107 can be pumped by pump 106 through the heat exchanger 105. Generally, the working fluid 107 used in the solar energy collection and storage system 101 can be any liquid phase material. The working fluid 107 can be selected so that the fluid remains a liquid during normal working conditions. For example, in some embodiments the working fluid can experience temperatures anywhere between 140° C. and 1000° C., and potentially even higher or lower, during normal operating conditions. Examples of potential working fluids 107 include, but are not limited to, water, salts, liquid metals, synthetic oils, mineral oils, Fluorinert, and even supercritical water or super critical carbon dioxide if the system is maintained at a high pressure.

The heat exchanger 105 can be designed so that the working fluid 107 retrieves the heat from the cold side 104(b). Since the heat exchanger 105 removes heat from the cold side 104(b) of the solar thermoelectric generator 104, the heat exchanger 105 can be designed to maintain an optimum working temperature of the solar thermoelectric generator 104 for the generation of electricity $E_1$.

Figure 2:
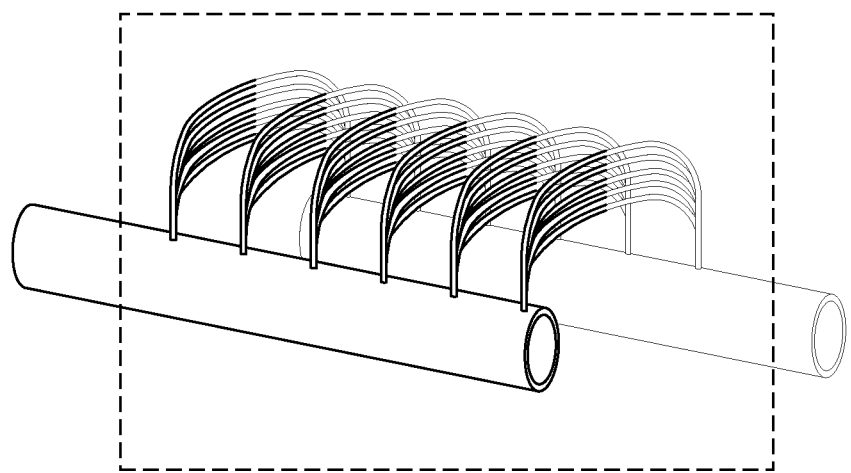
FIG. 2 depicts an example of channels in a thermal storage medium.
Figure 3:
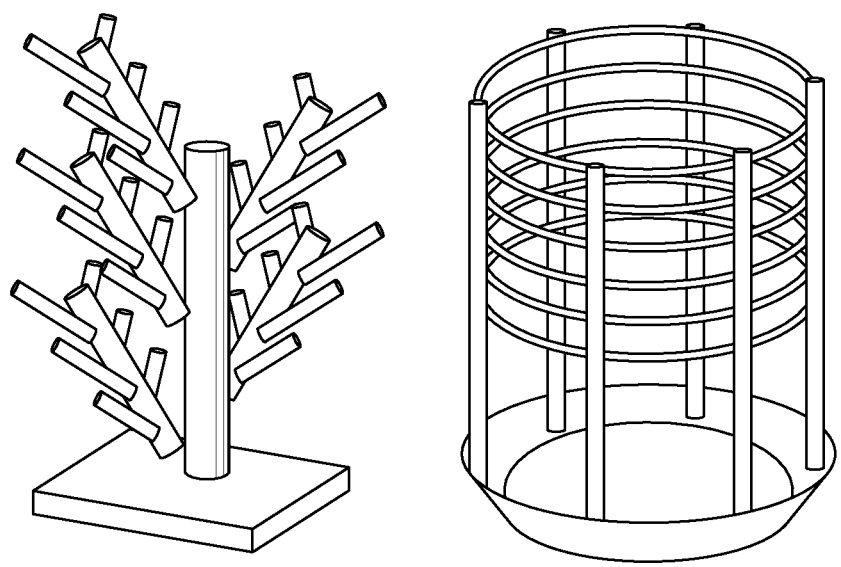
FIG. 3 depicts two examples of solid-based heat collectors that can be placed inside a thermal storage medium.

After the working fluid 107 receives heat from the heat exchanger 105, it can enter a thermal storage medium 108. Inside the thermal storage medium 108, the working fluid 107 can transfer the heat to the thermal storage medium 108 for storage. Generally, the thermal storage medium 108 can be a solid medium or a gel medium. The thermal storage medium 108 can also be a material that changes phases depending on the temperature of the working fluid 107. Examples of thermal storage mediums 108 include, but are not limited to, concrete, cast steel, salt, graphite, and polymer gel. Furthermore, the thermal storage medium 108 is inside a thermally insulated container (not shown) to maintain its temperature. The thermal storage medium 108 also contains channels (not shown) to allow the working fluid 107 to move throughout the thermal storage medium 108. These channels can be designed so that the working fluid 107 can move through these channels and simultaneously transfer heat to the thermal storage medium 108. Depending on the material of the thermal storage medium 108, the channels can be designed similar to blood vessels in the human body, which naturally and effectively supply or remove heat to the surrounding areas. FIG. 2 depicts an example of channels resembling a blood vessel like structure. Furthermore, to better supply heat to the entire thermal storage medium 108, the thermal storage medium 108 can include one or more solid-based heat collectors. Examples of solid-based heat collectors are shown in FIG. 3.

Once the working fluid 107 transfers its heat to the thermal storage medium 108, the working fluid 107 can exit the thermal storage medium 108 and return to pump 106 to complete the cycle again. Pump 106 can control the rate at which working fluid 107 moves through the heat exchanger 105 and the thermal storage medium 108. Thus, pump 106 can control the rate at which the working fluid is heated up at the cold side 104(b) of the solar thermoelectric generator and mostly determine the temperature of the cold side of 104.

Once the thermal energy is stored in the thermal storage medium 108, the thermal energy can be retrieved by working fluid 109 in order to generate more electricity and heat a lower temperature fluid, such as water, on demand. In this example, the heated fluid is water. Similar to working fluid 107, the type of working fluid 109 generally used in the solar energy collection and storage system 101 can be any liquid phase material.

Working fluid 109 can be pumped by pump 110 through channels in the thermal storage medium 108, where it can retrieve the stored heat. The channels in the thermal storage medium 108 for working fluid 109 and working fluid 107 can be separated in order to prevent either of the fluids from coming into contact with the other fluid. After working fluid 109 retrieves heat from and exits the thermal storage medium 108, it can enter heat exchanger 111 which is attached to the hot side 113(a) of the thermoelectric generator 113.

Heat from the working fluid 109 can be transferred through heat exchanger 111 to the hot side 113(a) of the thermoelectric generator 113. The heat transferred to the hot side 113(a) can increase the temperature of the hot side 113(a) and can create a temperature difference between the hot side 113(a) and the cold side 113(b) of the thermoelectric generator 113. Thus, electricity $E_2$ can be generated from the temperature difference across the thermoelectric generator 113.

As the hot side 113(a) continues to obtain heat from heat exchanger 111 and working fluid 109, heat from the hot side 113(a) transfers to the cold side 113(b) via heat conduction. It is important to maintain a proper temperature difference in the thermoelectric generator 113. Thus, a heat exchanger 112 can be attached to the cold side 113(b) to remove heat better from the cold side 113(b) of the thermoelectric generator 113. By removing the heat from the cold side 113(b) effectively, a lower cold side temperature at 113(b) and a larger temperature difference across the thermoelectric generator 113 can be maintained.

Fluid 117 can be pumped by pump 116 from a fluid reservoir 115 through the heat exchanger 112. Generally, fluid 117 can be a variety of fluids. For residential applications, fluid 117 can be water. Also, the temperature of fluid 117 before entering the heat exchanger 112 can be anywhere between 0° C. and 60° C. and potentially even higher or lower.

The heat exchanger 112 can be designed so that the fluid 117 retrieves the heat from the cold side 113(b) of the thermoelectric generator 113. Since the heat exchanger 111 transfers heat to the hot side 113(a) of the thermoelectric generator 113 and the heat exchanger 112 removes heat from the cold side 113(b), the heat exchanger 112 and heat exchanger 111 can be designed to maintain an optimum temperature difference across the thermoelectric generator 113 for the generation of electricity $E_2$.

After the heated fluid 117 exits heat exchanger 112, it can be stored in a fluid storage vessel 118. The fluid storage vessel 118 can be an insulated container that maintains the temperature of the fluid 117 inside it. The temperature of fluid 117 inside the fluid storage vessel can exist at a variety of different temperatures depending on the specifics of the solar collection and storage system 101. For example, if fluid 117 is water, the water can be at a temperature around 80° C. in the fluid storage vessel 118. Generally, the heated fluid 117 in the fluid storage vessel 118 can be used for a variety of purposes. In residential applications, heated fluid 117 can be a hot water supply used for showers, dishwashers, etc., and even heating the residence. For example, hot water can be used to heat the air and be circulated throughout the house.

After working fluid 109 exits heat exchanger 111, it can enter a controlled switch or bypass 114. The controlled switch or bypass 114 can direct the working fluid 109 toward the fluid storage vessel 118 or toward pump 110. If the working fluid 109 is directed toward the fluid storage vessel 118, it can enter isolated channels 119 that are inside the fluid storage vessel 118. The isolated channels 119 can be designed so that working fluid 109 does not come into contact with the stored fluid 117. The working fluid 109 can pass through the fluid storage vessel 118 via the isolated channels 119 and can return to pump 110 to complete the cycle again. While inside the isolated channels 119, the working fluid 109 can transfer excess heat to the fluid 117 that is stored in the fluid storage vessel 118. When switching toward pump 110 directly, more electricity $E_2$ but less hot fluid 117 in storage vessel 118 is generated.

Pump 110 can control the rate at which working fluid 109 moves through the thermal storage medium 108 and the heat exchanger 111. Pump 116 can control the rate at which fluid 117 moves through heat exchanger 112 and into the fluid storage vessel 118. Thus, pump 110 and pump 116 can work together to control the temperature gradient across TE module 113 and electricity generation $E_2$. While both pumps have an effect, pump 110 is the primary factor which determines the heating rate of fluid 117.

Figure 4:
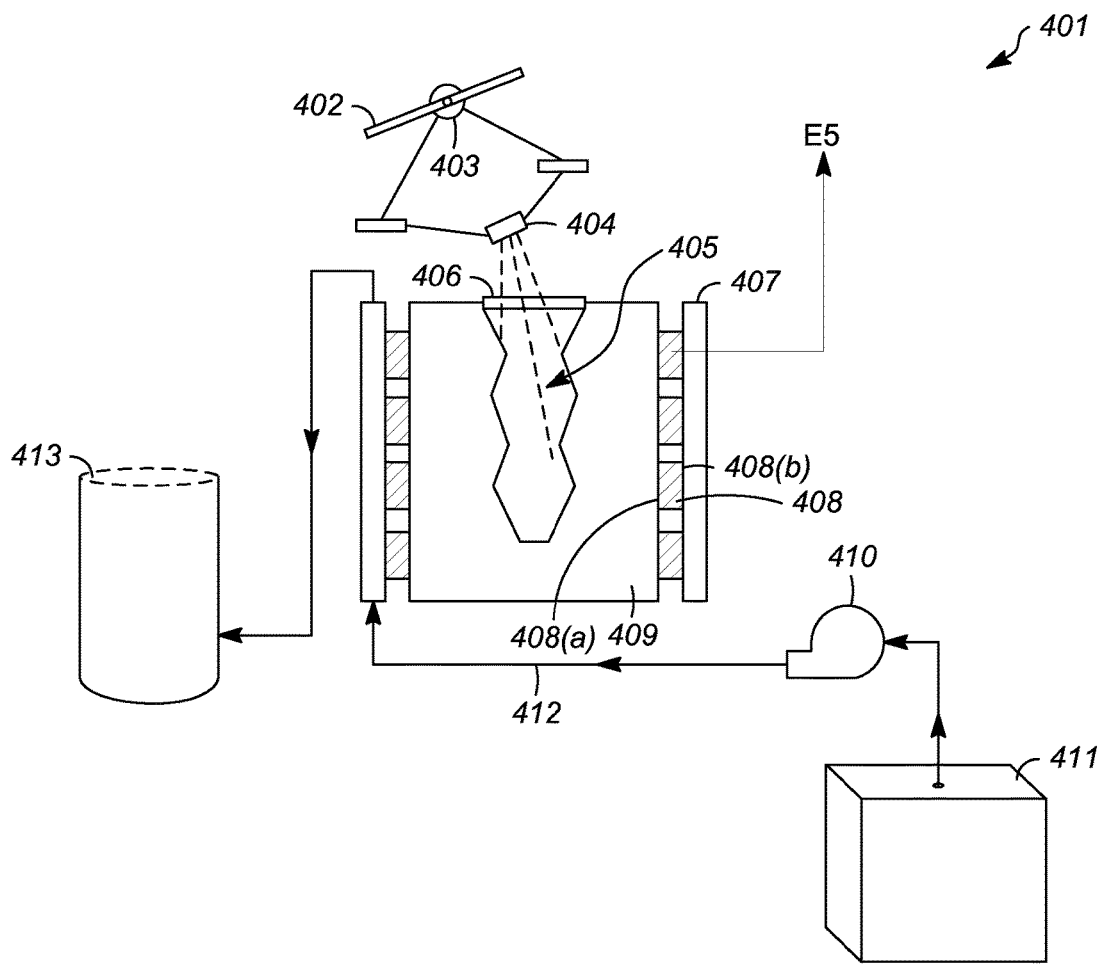
FIG. 4 is a cross sectional view of the thermal storage medium in a direct solar energy collection and storage system that is encompassed by a thermoelectric generator.

Another embodiment relates to a direct solar energy collection and storage system 401, as depicted in FIG. 4. The direct solar energy collection and storage system 401 can store solar thermal energy in a thermal storage medium 409 directly from solar radiation. The heat from the thermal storage medium 409 can be used to generate electricity $E_5$ and heat a fluid, such as water, on demand.

Similar to the system depicted in FIG. 1, the direct solar energy collection and storage system 401 can contain a solar radiation concentrator 402 and a sun-ray tracker 403. The solar radiation concentrator 402 can be the same as the solar radiation concentrator 102 used in the solar energy collection and storage system 101 depicted in FIG. 1. Also, the sun-ray tracker 403 can be the same as the sun-ray tracker 103 used in the solar energy collection and storage system 101 depicted in FIG. 1. The sun-ray tracker 403 can move the solar radiation concentrator 402 so as to align it with a solar radiation source in order to maximize the amount of solar radiation that comes in contact with the solar radiation concentrator 401.

The solar radiation concentrated by the solar radiation concentrator 401 can be directed toward an active light tube 404. The active light tube 404 can direct the solar radiation into a thermal storage medium 409. The solar radiation concentrator 402, the sun-ray tracker 403, and the active light tube 404 can be designed to maximize the amount of solar radiation directed into the thermal storage medium 409.

The thermal storage medium 409 can include a window 406 and a chamber 405. The window 406 can allow solar radiation entry into the chamber 405 of the thermal storage medium 409. The chamber 405 can be a hollow area inside the thermal storage medium 409. The chamber 405 can be designed to direct the light deep into it and generate the heat from the solar radiation absorption.

Figure 5:
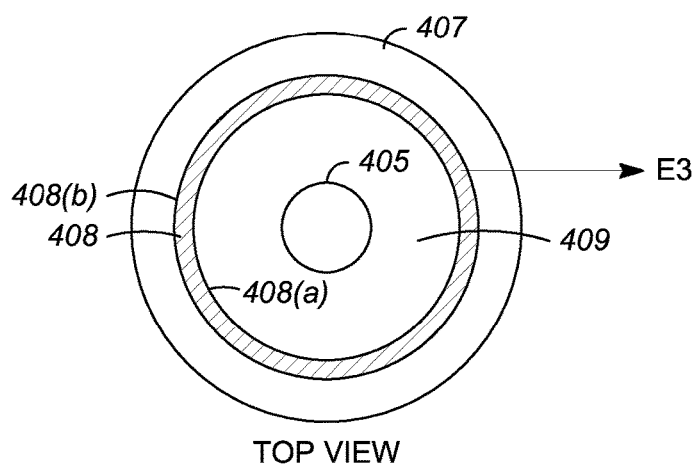
FIG. 5 is a top view of the thermal storage medium depicted in FIG. 4.

The heat absorbed from the solar radiation by the chamber 405 can be transferred to the thermal storage medium 409 for storage. Generally, the thermal storage medium 409 can be a solid medium or a gel medium. The thermal storage medium 409 can also be a phase change material depending on the normal working temperature. For example, the thermal storage medium 409 can experience temperatures anywhere between 100° C. and 1000° C. and potentially even higher or lower. Examples of thermal storage mediums 409 include, but are not limited to, concrete, cast steel, salt, graphite, and polymer gel. Furthermore, the thermal storage medium 409 can be inside a thermally insulated container to maintain its temperature. FIG. 5 is a top view of the thermal storage of FIG. 4. To better supply heat to the entire thermal storage medium 409, the thermal storage medium 409 can include one or more solid-based heat collectors. Examples of solid-based heat collectors are shown in FIG. 3.

Figure 6:
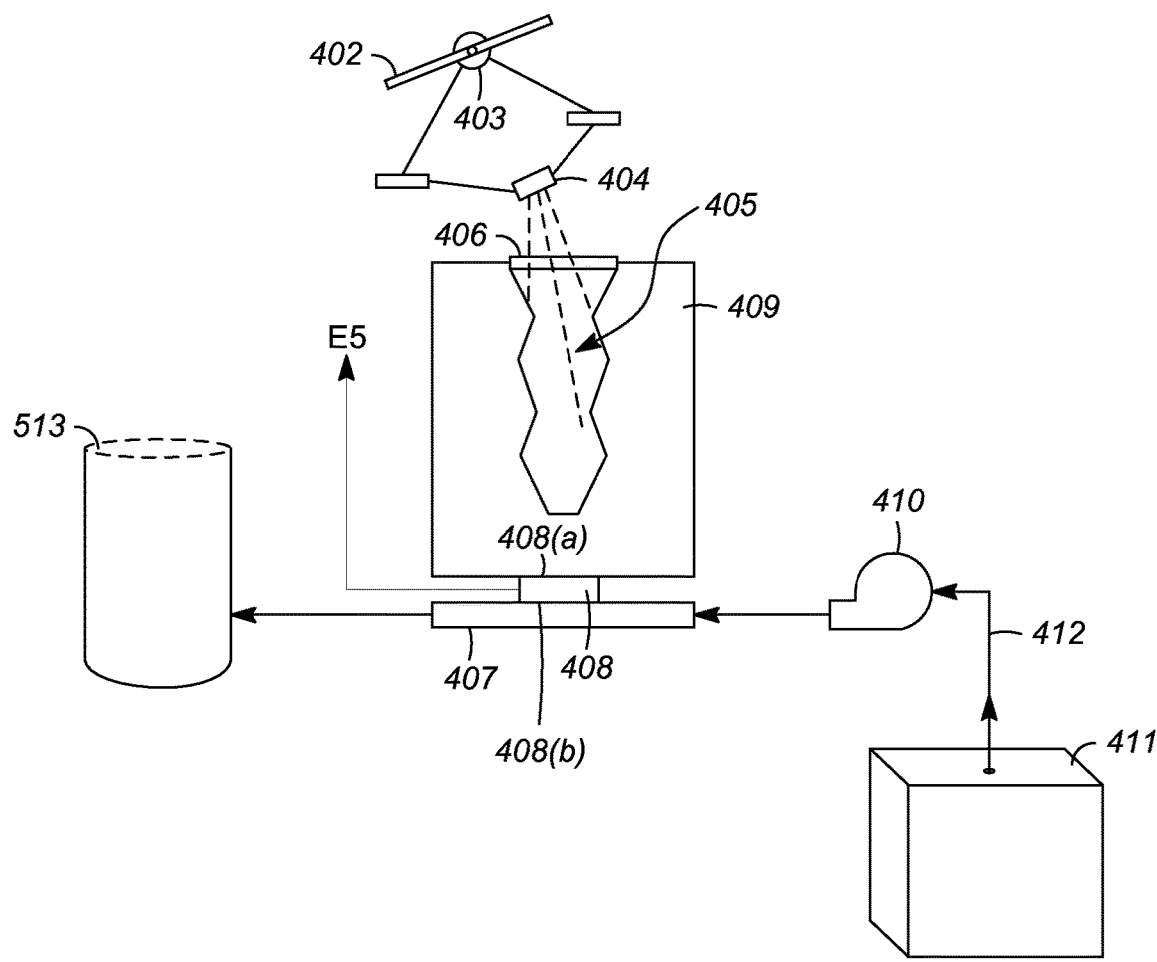
FIG. 6 is a cross sectional view of a thermal storage medium in a direct solar energy collection and storage system that is attached to a thermoelectric generator.

One or more thermoelectric generators 408 can be attached to one or more sides of the thermal storage medium 409. For example, the thermoelectric generator 408 can surround the thermal storage medium 409 (e.g. cylinder, wedge, rectangular, pentagonal, hexagonal, or octagonal column shape) as depicted in FIGS. 4 and 5. FIG. 5 is the case of a cylinder shape. Additionally, a thermoelectric generator 408 can be attached to the bottom of a thermal storage medium 409 as depicted, for example, in FIG. 6. The heat from the thermal storage medium 409 can transfer to the hot side 408(a) of the thermoelectric generator 408. This heat can increase the temperature of the hot side 408(a) and can create a temperature difference between the hot side 408(a) and the cold side 408(b) of the thermoelectric generator 408. Thus, electricity $E_5$ can be generated from the temperature difference across the thermoelectric generator 408.

As the hot side 408(a) continues to obtain heat from the thermal storage medium 409, heat from the hot side 408(a) transfers to the cold side 408(b) via heat conduction. A heat exchanger 407 can be attached to the cold side 408(b) so that it removes heat from the cold side 408(b) of the thermoelectric generator 408. By removing the heat from the cold side 408(b), a large temperature difference can be maintained across the thermoelectric generator 408.

Fluid 412 can be pumped by pump 410 from a fluid reservoir 411 through the heat exchanger 407. Generally, fluid 412 can be a variety of fluids. For residential applications, fluid 412 can be water. The temperature of fluid 412 before entering the heat exchanger 407 can be anywhere between 0° C. and 60° C. and potentially even higher or lower.

The heat exchanger 407 can be designed so that the fluid 412 retrieves the heat from the cold side 408(b) of the thermoelectric generator 408. Since the heat exchanger 407 removes heat from the cold side 408(b), the heat exchanger 407 can be designed to maintain an optimum temperature difference across the thermoelectric generator 408 for the generation of electricity $E_5$.

After the heated fluid 412 exits heat exchanger 407, it can be stored in a fluid storage vessel 413. The fluid storage vessel 413 can be an insulated container that maintains the temperature of the fluid 412 inside it. The temperature of fluid 412 inside the fluid storage vessel 413 can vary depending on the specifics of the direct solar collection and storage system 401. For example, if fluid 412 is water, the water can be at a temperature around 80° C. in the fluid storage vessel 413. Generally, the heated fluid 412 in the fluid storage vessel 413 can be used for a variety of purposes. In residential applications, heated fluid 412 can be a hot water supply used for showers, dishwashers, etc., and even heating the residence. For example, hot water can be used to heat the air and be circulated throughout the house.

Pump 410 can control the rate at which fluid 412 moves through the heat exchanger 407 and into the fluid storage vessel 413. Thus, pump 410 can control the rate at which heat is removed from the cold side 408(b) of the thermoelectric generator 408 and stored in vessel 413 and the temperature of the fluid 412.

When solar radiation is not present, an electric current can be applied to the thermoelectric generator 408 to maintain the temperature of the thermal storage medium 409. When direct current is applied to a thermoelectric device, heat from one side of the device transfers to the other side of the device against the temperature gradient (i.e., from cold to hot). Therefore, when a current is applied to the thermoelectric generator 408, the thermoelectric generator 408 can act as a heat pump for the thermal storage medium 409. The thermoelectric generator 408 can thus add heat to the thermal storage medium 409 to maintain its temperature. When the required temperature of thermal storage medium 409 is much higher than the maximum cooling temperature of thermoelectric generator 408, the heat pump efficiency is low and it works mostly like an electrical resistor heater. In this case, the pump 410 should be turned off so as to have better thermal insulation to the ambient.

In some examples, a solar energy collection and storage system is disclosed. The solar energy collection and storage system may comprise: a first energy converter with a first side and a second side; a solar radiation concentrator so as to concentrate solar radiation on the first side of the first energy converter; a first heat exchanger attached to the second side of the first energy converter, wherein a first fluid moves through the first heat exchanger and then through a thermal storage medium; a second energy converter with a first side and a second side; a second heat exchanger attached to the first side of the second energy converter, wherein a second fluid moves through the thermal storage medium and then through the second heat exchanger, the thermal storage medium configured to allow the first fluid to move through the thermal storage medium without coming into contact with the second fluid; and a third heat exchanger attached to the second side of the second energy converter, wherein a third fluid moves through the third heat exchanger and then into a fluid storage vessel. Additionally or alternatively to one or more examples disclosed above, in other examples, the thermal storage medium is inside a thermally insulated container. Additionally or alternatively to one or more examples disclosed above, in other examples, the thermal storage medium contains a plurality of channels configured for at least one of to allowing fluid to move through and resembling blood vessels. Additionally or alternatively to one or more examples disclosed above, in other examples, the thermal storage medium comprises at least one of a solid, a gel, and a phase change material. Additionally or alternatively to one or more examples disclosed above, in other examples, the first energy converter is at least one of a solar thermoelectric generator and a photovoltaic electrical generator. Additionally or alternatively to one or more examples disclosed above, in other examples, the second energy converter is a thermoelectric generator. Additionally or alternatively to one or more examples disclosed above, in other examples, the third fluid is water. Additionally or alternatively to one or more examples disclosed above, in other examples, the solar radiation concentrator tracks the sun movement. Additionally or alternatively to one or more examples disclosed above, in other examples, the solar energy collection and storage system further comprises a controlled switch configured to change on demand the direction of the second fluid exiting the second heat exchanger to the fluid storage vessel or to bypass to the second fluid pump after the exit of the fluid storage vessel. Additionally or alternatively to one or more examples disclosed above, in other examples, the first fluid returns to the first heat exchanger after exiting the thermal storage medium. Additionally or alternatively to one or more examples disclosed above, in other examples, the second fluid returns to the thermal storage medium after exiting the fluid storage vessel. Additionally or alternatively to one or more examples disclosed above, in other examples, the fluid storage vessel is configured to allow the second fluid exiting the second heat exchanger to move through the fluid storage vessel without coming into contact with the third fluid.

In some examples, a solar energy collection and storage system is disclosed. The solar energy collection and storage system may comprise: a solar radiation concentrator so as to concentrate solar radiation on a light-tube, wherein the prism is configured to direct solar radiation into a thermal storage medium; an energy converter with a first side and a second side, wherein the first side of the energy converter is attached to the thermal storage medium; and a heat exchanger attached to the second side of the energy converter, wherein a fluid moves through the heat exchanger and then into a fluid storage vessel. Additionally or alternatively to one or more examples disclosed above, in other examples, the solid-based heat collector includes multiple branch-like appendages for dispersing heat throughout the thermal storage medium. Additionally or alternatively to one or more examples disclosed above, in other examples, the solid-based heat collector is a circular cage-like structure. Additionally or alternatively to one or more examples disclosed above, in other examples, the thermal storage medium includes at least one of a solid-based heat collector, a window that allows solar radiation to enter, and a chamber into which the solar radiation is directed. Additionally or alternatively to one or more examples disclosed above, in other examples, the energy converter is a thermoelectric generator. Additionally or alternatively to one or more examples disclosed above, in other examples, the thermal storage medium is inside a thermally insulated container. Additionally or alternatively to one or more examples disclosed above, in other examples, the thermal storage medium comprises at least one of a solid, a gel, and a phase change material. Additionally or alternatively to one or more examples disclosed above, in other examples, the fluid is water. Additionally or alternatively to one or more examples disclosed above, in other examples, the solar radiation concentrator tracks the sun movement.

In some examples, a process of collecting and storing solar energy is disclosed. The process of collecting and storing solar energy may comprise: concentrating solar radiation on a first side of a first energy converter; generating electricity via the first energy converter; heating a first fluid by moving the first fluid through a first heat exchanger that is attached to a second side of the first energy converter; storing the heated first fluid in a thermal storage medium; moving the heated first fluid through a second heat exchanger that is attached to a first side of a second energy converter; generating electricity via the second energy converter; heating a second fluid by moving the second fluid through a third heat exchanger that is attached to a second side of the second energy converter; and storing the heated second fluid in a fluid storage vessel. Additionally or alternatively to one or more examples disclosed above, in other examples, the first energy converter is a solar thermoelectric generator. Additionally or alternatively to one or more examples disclosed above, in other examples, the first energy converter is a photovoltaic electrical generator. Additionally or alternatively to one or more examples disclosed above, in other examples, the second energy converter is a thermoelectric generator. Additionally or alternatively to one or more examples disclosed above, in other examples, the first fluid moves through the fluid storage vessel after exiting the second heat exchanger to further heat the second fluid. Additionally or alternatively to one or more examples disclosed above, in other examples, the process of collecting and storing solar energy further comprises controlling whether the first fluid enters the fluid storage vessel using a bypass. Additionally or alternatively to one or more examples disclosed above, in other examples, the process of collecting and storing solar energy further comprises reusing the first fluid in the first heat exchanger after the first fluid exits the fluid storage vessel. Additionally or alternatively to one or more examples disclosed above, in other examples, the process of collecting and storing solar energy further comprises reusing the first fluid in the first heat exchanger after the first fluid exits the second heat exchanger. Additionally or alternatively to one or more examples disclosed above, in other examples, the process of collecting and storing solar energy further comprises tracking a solar radiation source and moving a solar radiation concentrator to be perpendicular to the solar radiation source. Additionally or alternatively to one or more examples disclosed above, in other examples, the second fluid is water. Additionally or alternatively to one or more examples disclosed above, in other examples, the thermal storage medium is inside a thermally insulated container. Additionally or alternatively to one or more examples disclosed above, in other examples, the thermal storage medium comprises a solid. Additionally or alternatively to one or more examples disclosed above, in other examples, the thermal storage medium comprises a gel. Additionally or alternatively to one or more examples disclosed above, in other examples, the thermal storage medium comprises a phase change material.

In some examples, a process of collecting and storing solar energy is disclosed. The process of collecting and storing solar energy may comprise: concentrating solar radiation on a light-tube; directing the solar radiation into a thermal storage medium that is attached to a first side of an energy converter using the light-tube; heating the thermal storage medium with the solar radiation; generating electricity via the energy converter; heating a fluid by moving the fluid through a heat exchanger that is attached to a second side of the energy converter; and storing the heated fluid in a fluid storage vessel. Additionally or alternatively to one or more examples disclosed above, in other examples, the energy converter is a thermoelectric generator. Additionally or alternatively to one or more examples disclosed above, in other examples, the process of collecting and storing solar energy further comprises tracking a solar radiation source and moving a solar radiation concentrator to be perpendicular to the solar radiation source. Additionally or alternatively to one or more examples disclosed above, in other examples, the fluid is water. Additionally or alternatively to one or more examples disclosed above, in other examples, the thermal storage medium is inside a thermally insulated container. Additionally or alternatively to one or more examples disclosed above, in other examples, the thermal storage medium comprises a solid. Additionally or alternatively to one or more examples disclosed above, in other examples, the thermal storage medium comprises a gel. Additionally or alternatively to one or more examples disclosed above, in other examples, the thermal storage medium comprises a phase change material. Additionally or alternatively to one or more examples disclosed above, in other examples, the thermal storage medium includes a solid-based heat collector.

In some examples, a process of collecting and storing solar energy is disclosed. The process may comprise: concentrating solar radiation on a first side of a first energy converter; generating electricity via the first energy converter; heating a first fluid by moving the first fluid through a first heat exchanger that is attached to a second side of the first energy converter; heating a thermal storage medium with the heated first fluid; heating a second fluid by moving the second fluid through the thermal storage medium; moving the second fluid through a second heat exchanger that is attached to a first side of a second energy converter; generating electricity via the second energy converter; heating a third fluid by moving the third fluid through a third heat exchanger that is attached to a second side of the second energy converter; and storing the heated third fluid in a fluid storage vessel. Additionally or alternatively to one or more examples disclosed above, in other examples, the first energy converter is at least one of a solar thermoelectric generator and a photovoltaic electrical generator. Additionally or alternatively to one or more examples disclosed above, in other examples, the second energy converter is a thermoelectric generator. Additionally or alternatively to one or more examples disclosed above, in other examples, the second fluid moves through the fluid storage vessel after exiting the second heat exchanger to further heat the third fluid. Additionally or alternatively to one or more examples disclosed above, in other examples, the process of collecting and storing solar energy further comprises controlling whether the second fluid enters the fluid storage vessel using a bypass. Additionally or alternatively to one or more examples disclosed above, in other examples, the process of collecting and storing solar energy further comprises reusing the second fluid in the thermal storage medium after the second fluid exits the fluid storage vessel. Additionally or alternatively to one or more examples disclosed above, in other examples, the process of collecting and storing solar energy further comprises reusing the first fluid in the first heat exchanger after the first fluid exits the thermal storage medium. Additionally or alternatively to one or more examples disclosed above, in other examples, the process of collecting and storing solar energy further comprises tracking a solar radiation source and moving a solar radiation concentrator to be perpendicular to the solar radiation source. Additionally or alternatively to one or more examples disclosed above, in other examples, the second fluid is water. Additionally or alternatively to one or more examples disclosed above, in other examples, the thermal storage medium is inside a thermally insulated container. Additionally or alternatively to one or more examples disclosed above, in other examples, the thermal storage medium comprises a solid. Additionally or alternatively to one or more examples disclosed above, in other examples, the thermal storage medium comprises a gel. Additionally or alternatively to one or more examples disclosed above, in other examples, the thermal storage medium comprises a phase change material.

The above description is presented to enable a person skilled in the art to make and use the invention, and is provided in the context of a particular application and its requirements. Various modifications to the preferred embodiments will be readily apparent to those skilled in the art, and the generic principles defined herein may be applied to other embodiments and applications without departing from the spirit and scope of the invention. Thus, this invention is not intended to be limited to the embodiments shown, but is to be accorded the widest scope consistent with the principles and features disclosed herein.

We claim:

1. A solar energy collection and storage system, comprising:
   a first energy converter with a first side and a second side;
   a solar radiation concentrator so as to concentrate solar radiation on the first side of the first energy converter;

a first heat exchanger attached to the second side of the first energy converter, wherein a first fluid moves through the first heat exchanger and then through a thermal storage medium;
a second energy converter with a first side and a second side;
a second heat exchanger attached to the first side of the second energy converter, wherein a second fluid moves through the thermal storage medium and then through the second heat exchanger, the thermal storage medium configured to allow the first fluid to move through the thermal storage medium without coming into contact with the second fluid;
a fluid storage vessel configured to allow the second fluid to move through without coming into contact with a third fluid; and
a third heat exchanger attached to the second side of the second energy converter, wherein the third fluid moves through the third heat exchanger and then into the fluid storage vessel.

2. The solar energy collection and storage system of claim 1, wherein the thermal storage medium contains a plurality of channels configured for at least one of allowing fluid to move through and resembling blood vessels.

3. The solar energy collection and storage system of claim 1, wherein the thermal storage medium comprises at least one of a solid, a gel, and a phase change material.

4. The solar energy collection and storage system of claim 1, wherein the first energy converter is at least one of a solar thermoelectric generator and a photovoltaic electrical generator.

5. The solar energy collection and storage system of claim 1, wherein the second energy converter is a thermoelectric generator.

6. The solar energy collection and storage system of claim 1, wherein the first fluid returns to the first heat exchanger after exiting the thermal storage medium.

7. The solar energy collection and storage system of claim 1, further comprising a controlled switch configured to change on demand the direction of the second fluid exiting the second heat exchanger to flow through the fluid storage vessel or to bypass the fluid storage vessel.

8. The solar energy collection and storage system of claim 7, wherein the second fluid returns to the thermal storage medium after exiting the fluid storage vessel when the controlled switch changes on demand the direction of the second fluid exiting the second heat exchanger to flow through the fluid storage vessel.

9. A process of collecting and storing solar energy, the process comprising:
concentrating solar radiation on a first side of a first energy converter;
generating electricity via the first energy converter;
heating a first fluid by moving the first fluid through a first heat exchanger that is attached to a second side of the first energy converter;
storing the heated first fluid in a thermal storage medium;
moving the heated first fluid through a second heat exchanger that is attached to a first side of a second energy converter;
generating electricity via the second energy converter;
heating a second fluid by moving the second fluid through a third heat exchanger that is attached to a second side of the second energy converter; and
storing the heated second fluid in a fluid storage vessel, wherein the first fluid moves through the fluid storage vessel after exiting the second heat exchanger to further heat the second fluid.

10. A process of collecting and storing solar energy, the process comprising:
concentrating solar radiation on a first side of a first energy converter;
generating electricity via the first energy converter;
heating a first fluid by moving the first fluid through a first heat exchanger that is attached to a second side of the first energy converter;
heating a thermal storage medium with the heated first fluid;
heating a second fluid by moving the second fluid through the thermal storage medium;
moving the second fluid through a second heat exchanger that is attached to a first side of a second energy converter;
generating electricity via the second energy converter;
heating a third fluid by moving the third fluid through a third heat exchanger that is attached to a second side of the second energy converter; and
storing the heated third fluid in a fluid storage vessel, wherein the second fluid moves through the fluid storage vessel after exiting the second heat exchanger to further heat the third fluid.

11. The process of collecting and storing solar energy of claim 10, wherein the first energy converter is at least one of a solar thermoelectric generator and a photovoltaic electrical generator.

12. The process of collecting and storing solar energy of claim 10, further comprising reusing the first fluid in the first heat exchanger after the first fluid exits the thermal storage medium.

13. The process of collecting and storing solar energy of claim 10, further comprising tracking a solar radiation source and moving a solar radiation concentrator to be perpendicular to the solar radiation source.

* * * * *